(12) United States Patent
Mitarai et al.

(10) Patent No.: US 9,866,735 B2
(45) Date of Patent: Jan. 9, 2018

(54) CAMERA MODULE

(71) Applicant: SHARP KABUSHIKI KAISHA, Osaka-shi, Osaka (JP)

(72) Inventors: Kei Mitarai, Osaka (JP); Shohgo Hirooka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 127 days.

(21) Appl. No.: 14/377,424

(22) PCT Filed: Feb. 5, 2013

(86) PCT No.: PCT/JP2013/052551
§ 371 (c)(1),
(2) Date: Aug. 7, 2014

(87) PCT Pub. No.: WO2013/121923
PCT Pub. Date: Aug. 22, 2013

(65) Prior Publication Data
US 2015/0172519 A1  Jun. 18, 2015

(30) Foreign Application Priority Data

Feb. 17, 2012 (JP) .................................. 2012-033039
Jan. 10, 2013 (JP) .................................. 2013-002897

(51) Int. Cl.
*H04N 5/225* (2006.01)
*H01L 27/146* (2006.01)

(52) U.S. Cl.
CPC ..... *H04N 5/2252* (2013.01); *H01L 27/14618* (2013.01); *H04N 5/2251* (2013.01);
(Continued)

(58) Field of Classification Search
CPC ............. H01L 27/14618; H01L 5/2251; H01L 5/2257; H01L 5/2252; H01L 2224/73265; H01L 2224/48091; H01L 2924/00014
See application file for complete search history.

(56) References Cited

U.S. PATENT DOCUMENTS 7,235,887 B2 * 6/2007 Lee .................... H01L 24/32
257/777
8,680,636 B2 * 3/2014 Yajima ................ H01L 23/26
257/431

(Continued)

FOREIGN PATENT DOCUMENTS

| JP | 2004-342992 | 12/2004 |
| JP | 2008-251712 | 10/2008 |
| JP | 2012-009920 | 1/2012 |

OTHER PUBLICATIONS

International Search Report for PCT/JP2013/052551, dated Mar. 26, 2013.

(Continued)

*Primary Examiner* — Twyler Haskins
*Assistant Examiner* — Carramah J Quiett
(74) *Attorney, Agent, or Firm* — Nixon & Vanderhye P.C.

(57) ABSTRACT

A camera module of the present invention, provided by adhering a glass substrate to the cover body so that the glass substrate covers an opening of a sensor cover for covering an image pickup element mounted on a wiring substrate, which opening is provided above the image pickup element, the camera module includes: an image pickup package having an internal space provided by the glass substrate, the sensor cover, and the glass substrate; and an image pickup lens provided above the glass substrate of the image pickup package, wherein at least one ventilation groove (G) for allowing the internal space to communicate with open air is provided on an adhesive surface of the glass substrate of the sensor cover.

8 Claims, 14 Drawing Sheets

(52) U.S. Cl.
    CPC . *H04N 5/2257* (2013.01); *H01L 2224/48091* (2013.01); *H01L 2224/73265* (2013.01)

(56) References Cited

U.S. PATENT DOCUMENTS

| | | | |
|---|---|---|---|
| 2008/0237768 A1 | 10/2008 | Yajima et al. | |
| 2010/0149410 A1* | 6/2010 | Matsuzawa | H01L 23/10 |
| | | | 348/374 |
| 2013/0100343 A1* | 4/2013 | Oh | G03B 17/12 |
| | | | 348/374 |
| 2013/0241045 A1* | 9/2013 | Goida | B81B 7/0061 |
| | | | 257/704 |
| 2014/0264699 A1* | 9/2014 | Ryu | H01L 27/14618 |
| | | | 257/434 |

OTHER PUBLICATIONS

JP language Written Opinion of the International Searching Authority for PCT/JP2013/02551, dated Mar. 26, 2013.

\* cited by examiner

| 1 | : CAMERA MODULE |
|---|---|
| 10 | : IMAGE PICKUP PACKAGE |
| 11 | : WIRING SUBSTRATE |
| 12 | : ADHESIVE |
| 13 | : SOLID STATE IMAGE PICKUP ELEMENT |
| 14 | : SENSOR COVER |
| 14a | : OPENING |
| 16 | : ADHESIVE |
| 17 | : GLASS SUBSTRATE |
| 18 | : INTERNAL SPACE |
| 20 | : LENS UNIT |
| 21 | : IMAGE PICKUP LENS |
| 22 | : LENS HOLDER |
| G | : VENTILATION GROOVE |

(a)

(b)

F I G. 6
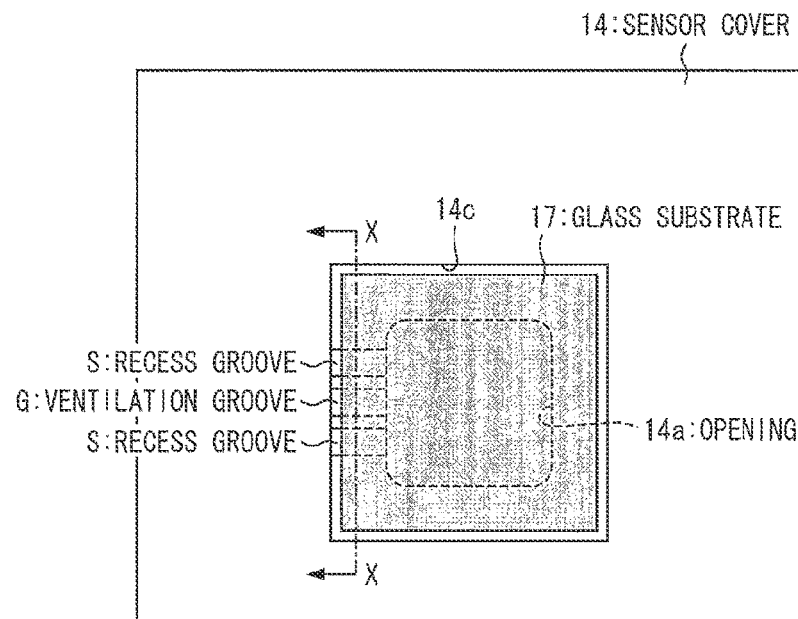
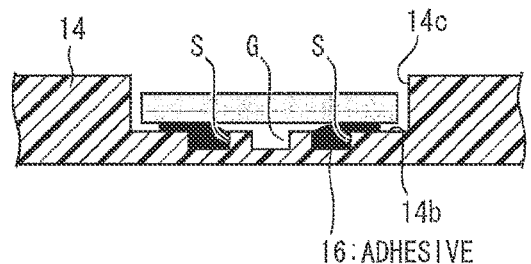

(a)

(b)

(a)

(b)

(c)

CAMERA MODULE

This application is the U.S. national phase of International Application No. PCT/JP2013/052551, filed 5 Feb. 2013, which designated the U.S. and claims priority to JP Application No. 2012-033039, filed 17 Feb. 2012, and JP Application No. 2013-2897, filed 10 Jan. 2013, the entire contents of each of which are hereby incorporated by reference.

TECHNICAL FIELD

The present invention relates to a camera module for capturing an image in a camera-equipped mobile phone, a digital camera, a security camera, or the like, and, specifically, relates to ventilation of an internal space of an image pickup package including an image pickup element, a wiring substrate, a lens, and a glass substrate.

BACKGROUND ART

A camera module for use in a camera-equipped mobile phone, a digital camera, a security camera, or the like is structured such that a solid state image pickup element such as CCD (Charge Coupled Device) and CMOS (Complementary Metal Oxide Semiconductor), a wiring substrate including a glass substrate and a terminal, a sensor cover retaining the solid state image pickup element and the wiring substrate, a lens, and a lens holder are integrated.

An example structure of such a camera module is illustrated in FIG. 13. As shown in FIG. 13, a camera module 100 includes: a lens unit 120 consisting of a lens 121 and a lens holder 122; and an image pickup package 110 in which a solid state image pickup element 113 is placed in an internal space 118 surrounded by a glass substrate 117, a sensor cover 114, and a wiring substrate 111.

In a case of the camera module 100 having the above structure, ideally, any foreign matters do not enter the internal space 118 of the image pickup package 110 because, when foreign matters are attached onto the solid state image pickup element 113, a captured image is deteriorated. However, in a case where the internal space 118 is airtight completely in order to prevent entry of foreign matters, gas in the internal space 118 thermally expands due to a rise in temperature, which results in a risk of breakage from a joint section. Further, gas and ions are generated from adhesives 112 and 116 etc. due to change in temperature or in atmospheric pressure, which steams up the glass substrate 117.

In order to solve the above problem, for example, in a solid state image pickup element 200 disclosed in Patent Literature 1, as shown in FIG. 14, an adhesive layer 219 is provided on an inside wall of an image pickup package 210, thereby preventing foreign matters from attaching onto a solid state image pickup element 213. Further, a through hole 211a connecting inside of the image pickup package 210 with an outside thereof is provided in a wiring substrate 211 placed directly under the solid state image pickup element 213, so that open air is circulated and gas and ions generated from the adhesive layer 219 due to change in temperature or in atmospheric pressure are released.

For example, as shown in (a) of FIG. 15, (b) of FIG. 15, and (c) of FIG. 15, Patent Literature 2 proposes an image sensor unit 300 having such a structure that a ventilation section for allowing an inside of the image pickup package 310 to communicate with an outside thereof is provided on a flat surface of a sensor cover 314. In the image sensor unit 300, when the sensor cover 314 and a glass substrate 317 are adhered to each other, a ventilation section V for allowing an internal space 318 to communicate with the outside is provided by providing a region to which an adhesive 316 is not applied. Further, because an opening section of the ventilation section V inside the image pickup package 310 is provided outside a region facing a light-receiving surface of an image pickup element 313, foreign matters entering the internal space 318 of the image pickup package 310 through the ventilation section V are difficult to fall and be attached onto the light-receiving surface.

CITATION LIST

Patent Literature 1

Patent Literature 1
Japanese Patent Application Publication, Tokukai, No. 2008-251712 A (Publication date: Oct. 16, 2008)

Patent Literature 2

Japanese Patent Application Publication, Tokukai, No. 2012-009920 A (Publication date: Jan. 12, 2012)

SUMMARY OF INVENTION

Technical Problem

However, the solid state image pickup element 200 serving as a camera module, disclosed in the above conventional Patent Literature 1, has problems below.

That is, the through hole 211a, which is provided to release gas and ions generated from the adhesive layer 219 due to change in temperature or in atmospheric pressure and allows an inside of the image pickup package 210 to communicate with an outside thereof, is provided through the wiring substrate 211 which is bottom of the camera module. Further, the through hole 211a is provided directly under the solid state image pickup element 213, the solid state image pickup element 213 and the wiring substrate 211 are partially adhered, and a thickness of each adhesive layer 212 is optimized. This makes it possible to release the gas and ions generated from the inside of the image pickup package 210 and also to prevent entry of foreign matters because foreign matters from outside are larger than the thickness of the adhesive layers 212.

However, since the adhesive layers 212 are partially applied, it is necessary to manage an inclination of the solid state image pickup element 213 merely with use of the adhesive layers 212 partially applied. Therefore, in a case where an application amount of the adhesive is different among applied parts, there is a possibility that the thickness of the layers is different and the inclined solid state image pickup element 213 is mounted on the wiring substrate 211.

Further, a case of partially adhering the solid state image pickup element 213 and the wiring substrate 211 to form a gap may lead to a weaker adhesive strength, as compared with a case of entirely adhering the interface solid state image pickup element 213 and the wiring substrate 211 without any gap. In order to keep the adhesive strength, it is necessary to increase an application amount of the adhesive. In a case where the application amount of the adhesive is increased, there is a possibility that, when the solid state image pickup element 213 is pressed to the adhesive layers 212, areas of the adhesive layers 212 partially applied are expanded and are then brought into contact with each other, which results in clogging the through hole 211a, i.e., the through hole 211a does not function.

Patent Literature 2 discloses that, as a ventilation section V, a region to which the adhesive 316 is not applied is provided at an adhering section of the sensor cover 314 and the glass substrate 317. However, this configuration has a similar problem to that of Patent Literature 1, specifically, when the glass substrate 317 is adhered to the sensor cover 314, the adhesive 316 is pressed, and an application area of the adhesive 316 and is wetted and expanded, and then the adhesive 316 intrudes into an area to which the adhesive 316 is not to be applied, which results in clogging the ventilation section. When the region to which the adhesive 316 is not to be applied is increased to prevent clogging of the ventilation section V with the adhesive 316, the potential of intrusion of foreign matters into the inside of the image pickup package 310 becomes higher. Therefore, in order to have an appropriate ventilation section V having both air-permeability and capability of preventing intrusion of foreign matters, it is necessary to manage the application amount, an application range, and a pressing amount of the adhesive 316, which is never easy.

The present invention has been made in view of the above problems, and an object of the present invention is to provide a camera module which can obtain air-permeability between an internal space and an open air of an image pickup package while an image pickup element is not being inclined.

Solution to Problem

In order to achieve the above object, a camera module of an aspect of the present invention includes a substrate, an image pickup element on the substrate, and a cover body for covering the image pickup element on the substrate, a transparent plate being attached to the cover body in such a manner that the transparent plate covers an opening of the cover body which opening is above the image pickup element, so that the substrate, the cover body, and the transparent plate define an internal space; and an image pickup lens provided above the transparent plate of the image pickup package, wherein at least one ventilation groove for allowing the internal space to communicate with open air is provided on a plane of the cover body on which plane the transparent plate is attached.

Advantageous Effects of Invention

In the camera module of an aspect of the present invention, as described above, the at least one ventilation groove for allowing the internal space to communicate with open air is provided on the adhesive surface of the transparent plate of the cover body.

Therefore, it is possible to provide a camera module which can obtain air-permeability between an internal space and an open air of an image pickup package while an image pickup element is not being inclined.

Figure 2:
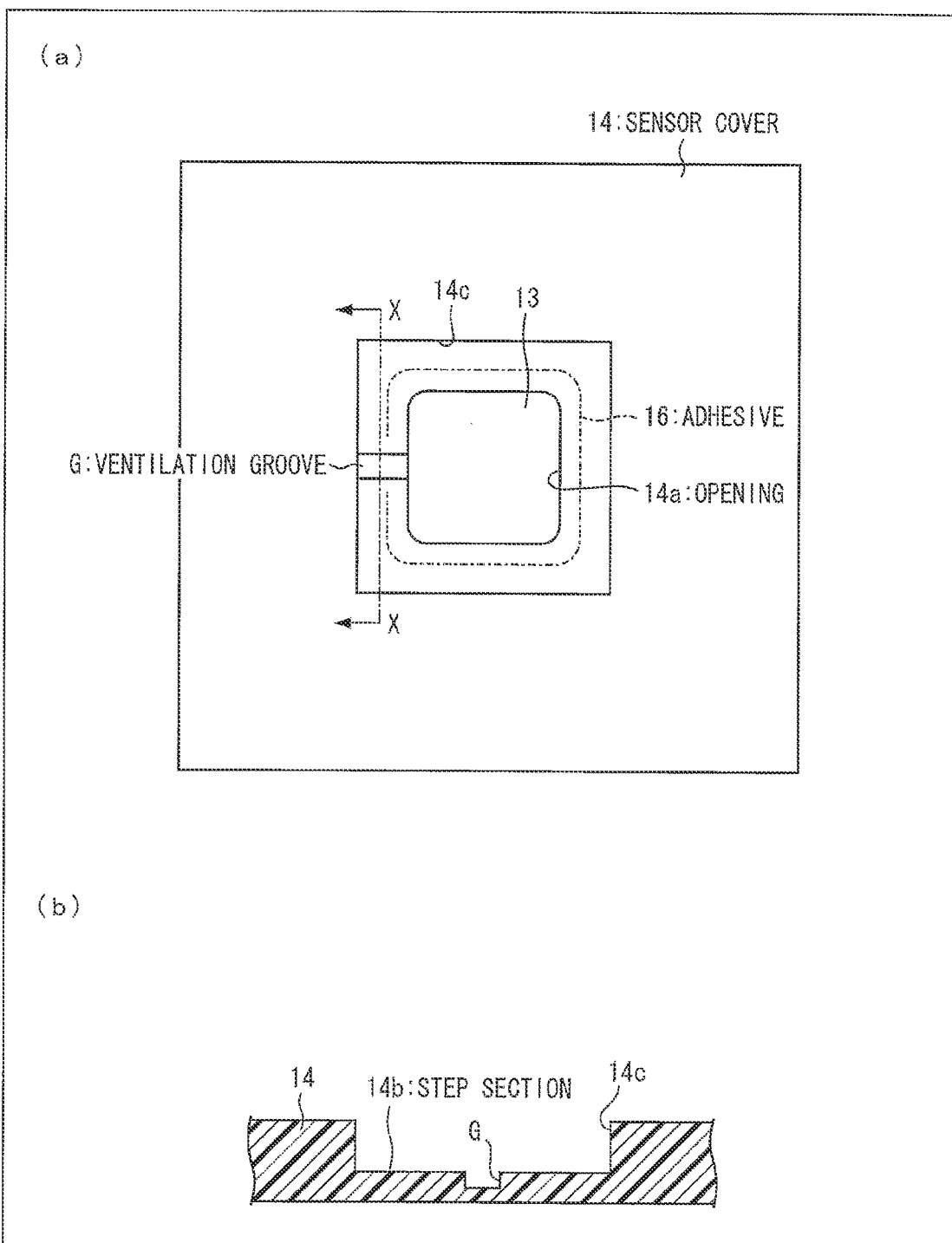

(a) of FIG. 2 is a plan view illustrating a configuration of an image pickup package of the camera module other than a glass substrate. (b) of FIG. 2 is a cross-sectional view taken along the arrows X-X of (a).

Figure 3:
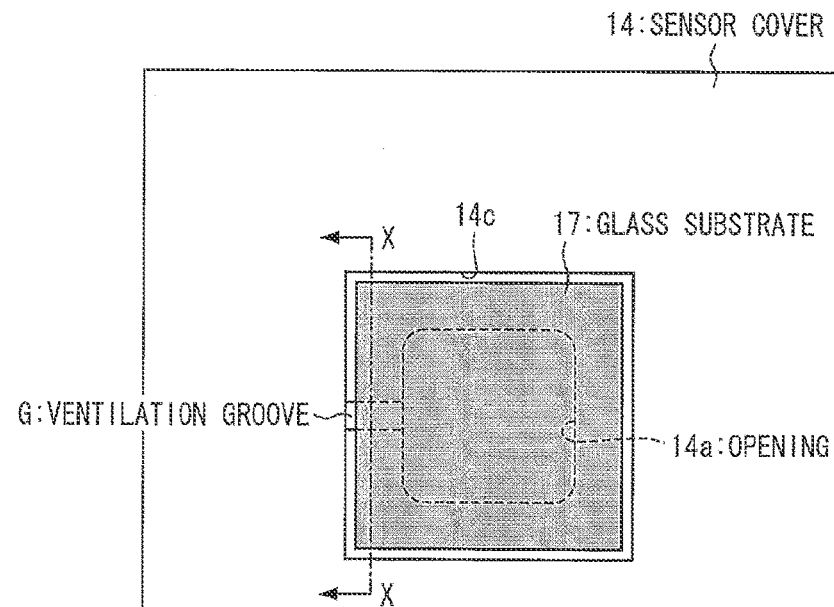
Figure 3:
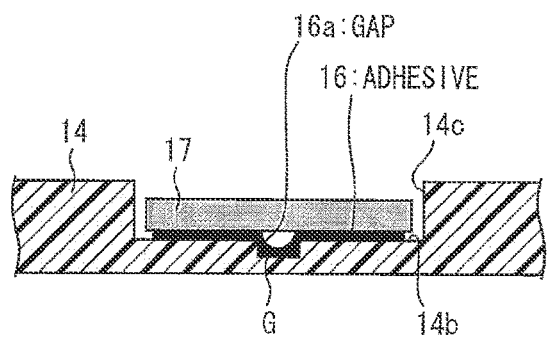

(a) of FIG. 3 is a plan view illustrating a configuration of an image pickup package of the camera module. (b) of FIG. 3 is a cross-sectional view taken along the arrows X-X of (a).

Figure 4:
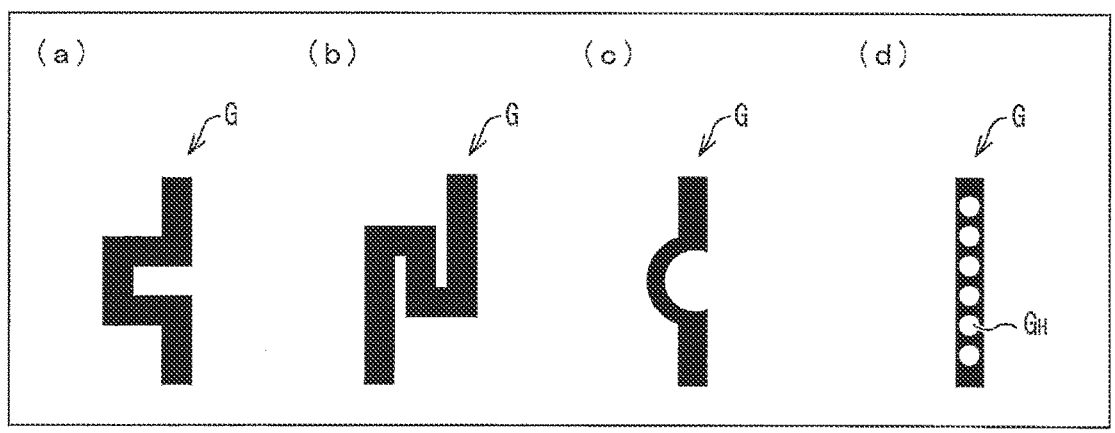

(a) to (d) of FIG. 4 are plan views illustrating shapes of a ventilation groove provided on a sensor cover of the image pickup package on a plan view.

Figure 5:
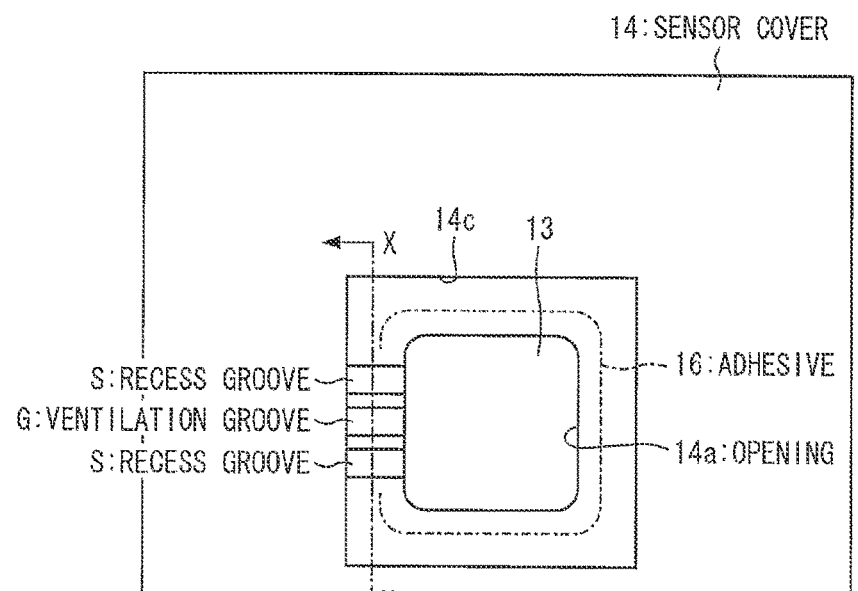
Figure 5:
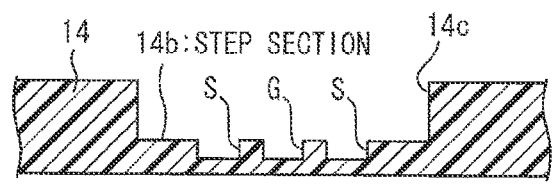

(a) of FIG. 5 is a plan view illustrating a configuration of a modified example of an image pickup package of the camera module other than a glass substrate. (b) of FIG. 5 is a cross-sectional view taken along the arrows X-X of (a).

(a) of FIG. 6 is a plan view illustrating a configuration of a modified example of an image pickup package of the camera module. (b) of FIG. 6 is a cross-sectional view taken along the arrows X-X of (a).

Figure 7:
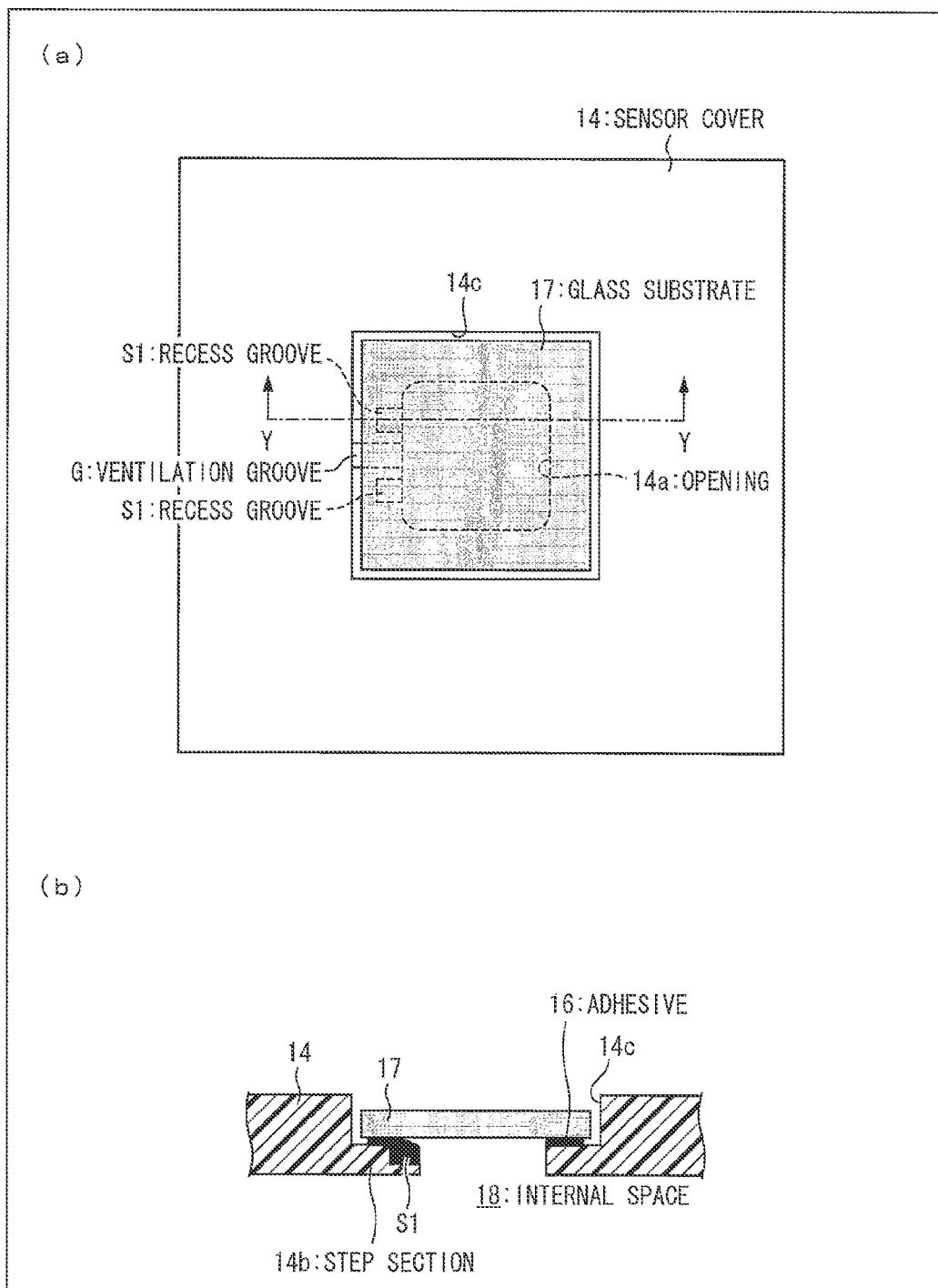

(a) of FIG. 7 is a plan view illustrating a configuration of another modified example of an image pickup package of the camera module. (b) of FIG. 7 is a cross-sectional view taken along the arrows Y-Y of (a).

Figure 8:
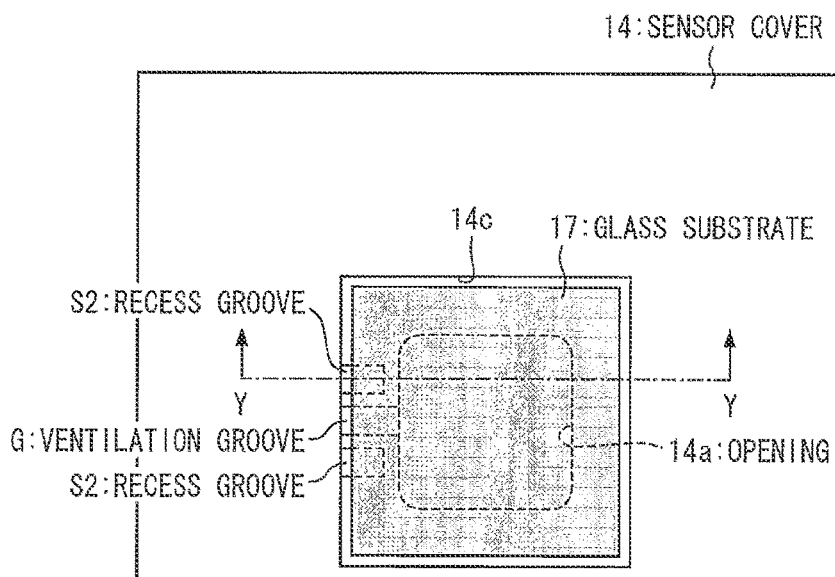
Figure 8:
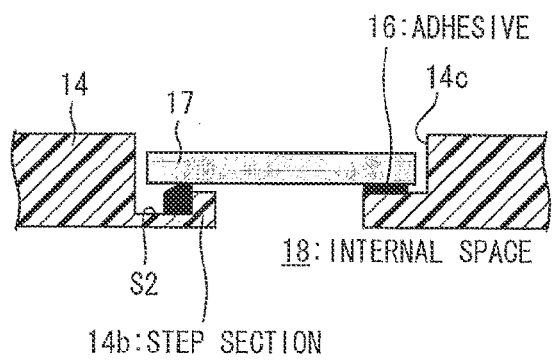

(a) of FIG. 8 is a plan view illustrating a configuration of still another modified example of an image pickup package of the camera module. (b) of FIG. 8 is a cross-sectional view taken along the arrows Y-Y of (a).

Figure 9:
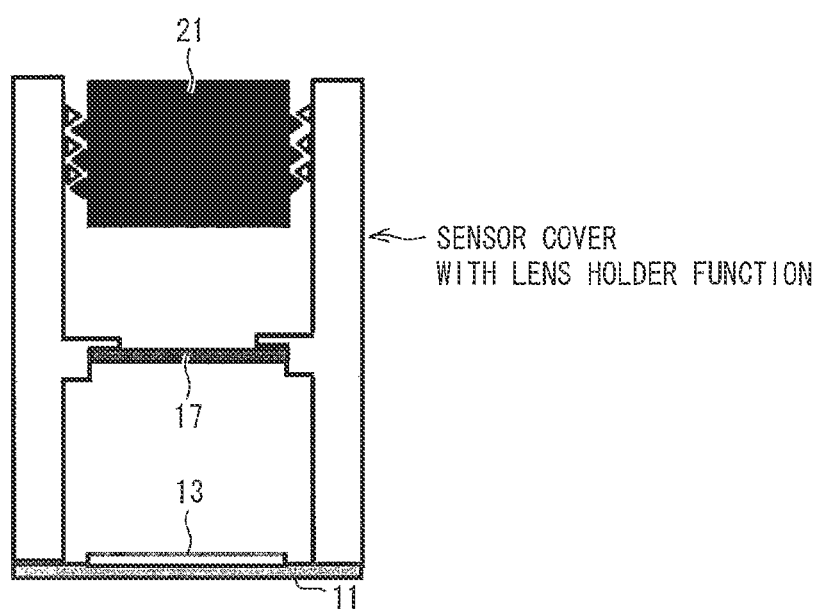

FIG. 9 is a cross-sectional view illustrating a configuration of a modified example of the camera module.

Figure 10:
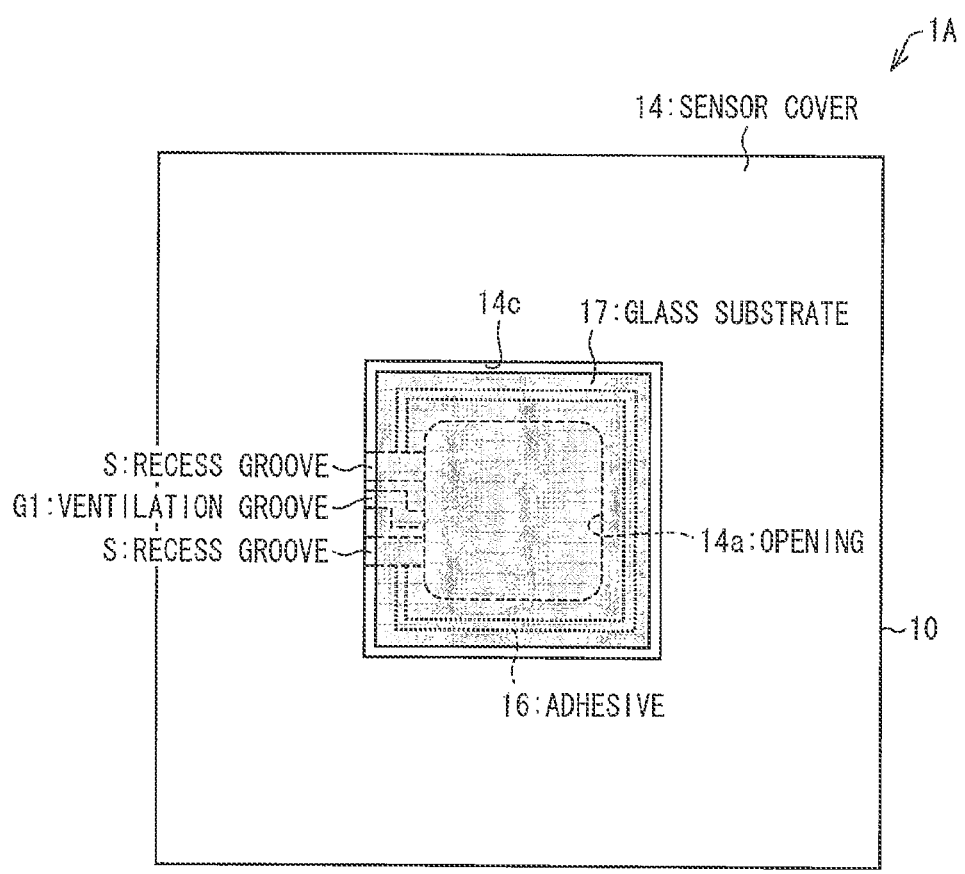

FIG. 10 is a plan view illustrating a configuration of an image pickup package in Embodiment 2 of the present invention.

Figure 11:
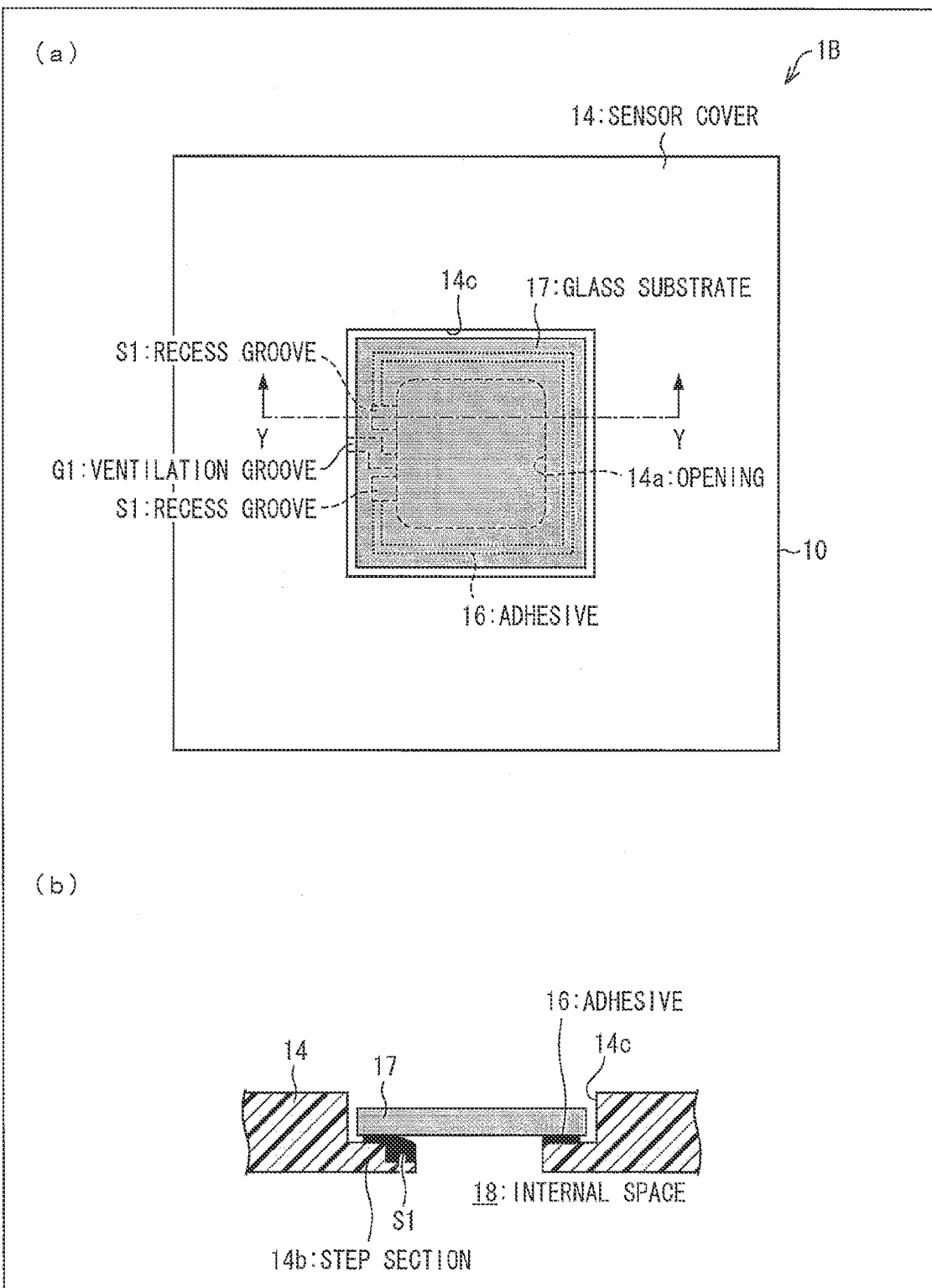

(a) of FIG. 11 is a plan view illustrating a configuration of an image pickup package of a camera module according to Embodiment 3 of the present invention. (b) of FIG. 11 is a cross-sectional view taken along the arrows Y-Y of (a).

Figure 12:
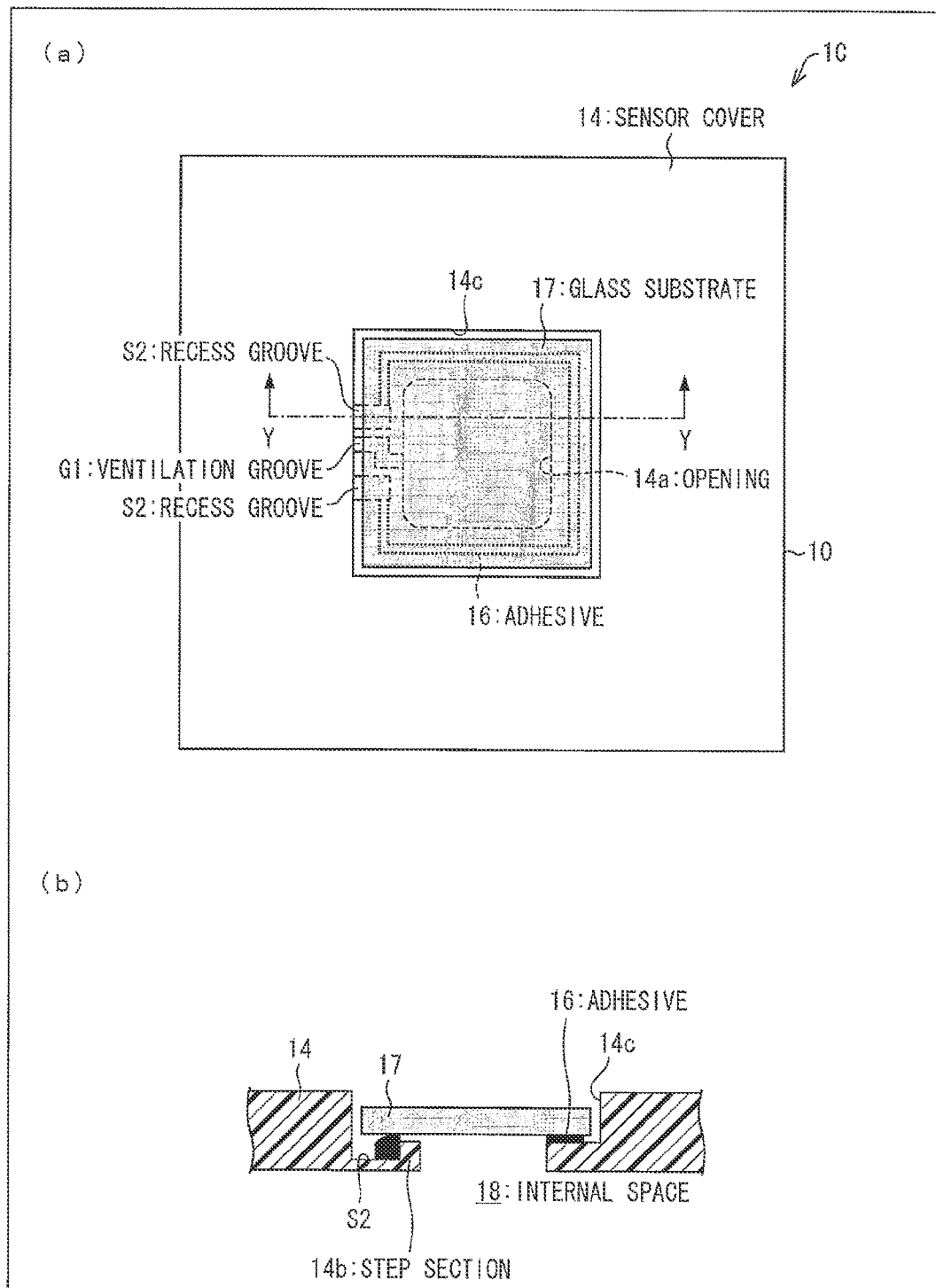

(a) of FIG. 12 is a plan view illustrating a configuration of an image pickup package of a camera module according to Embodiment 4 of the present invention. (b) of FIG. 12 is a cross-sectional view taken along the arrows Y-Y of (a).

Figure 13:
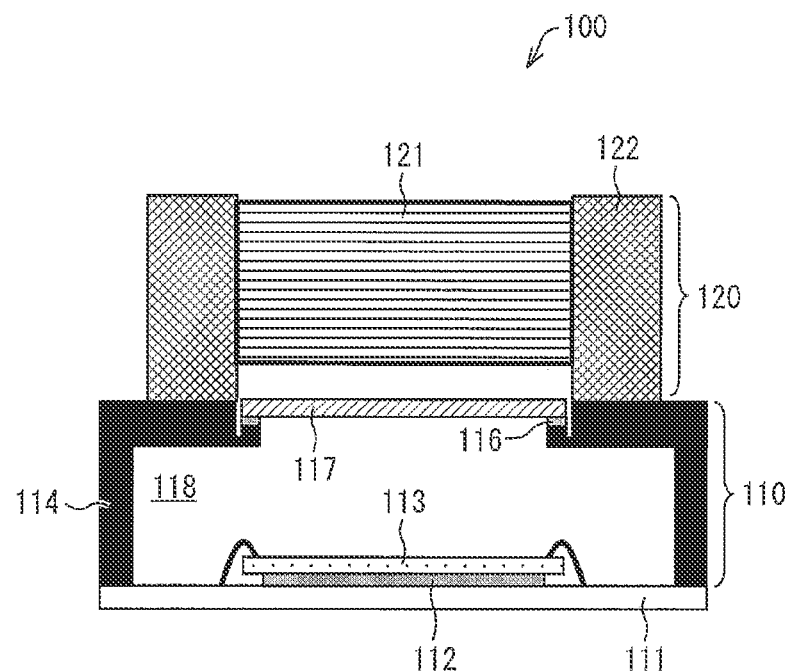

FIG. 13 is a cross-sectional view illustrating a configuration of a conventional camera module.

Figure 14:
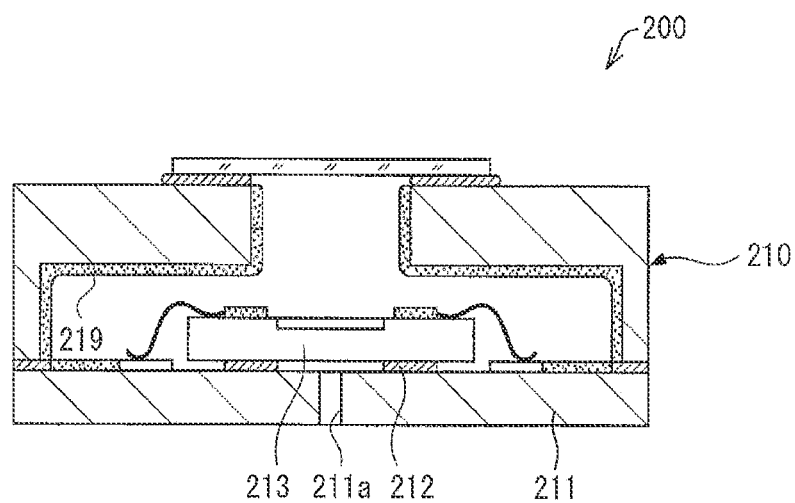

FIG. 14 is a cross-sectional view illustrating a configuration of another conventional camera module.

Figure 15:
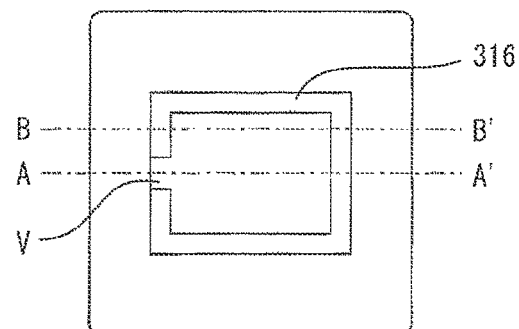
Figure 15:
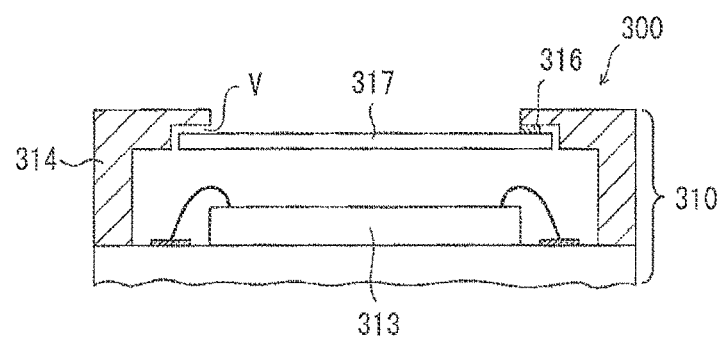
Figure 15:
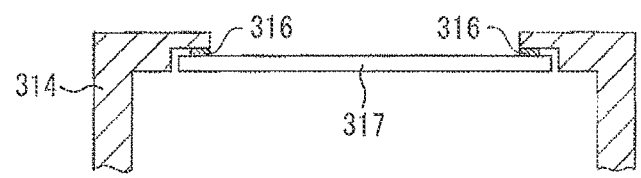

(a) of FIG. 15 is a plan view illustrating a configuration of an image sensor unit of still another conventional camera module. (b) of FIG. 15 is a cross-sectional view taken along the arrows A-A of (a), and (c) of FIG. 15 is a cross-sectional view taken along the arrows B-B of (a).

DESCRIPTION OF EMBODIMENTS

Embodiment 1

The following description will discuss an embodiment of the present invention with reference to FIGS. 1 to 9.

(Basic Configuration of Camera Module)

Figure 1:
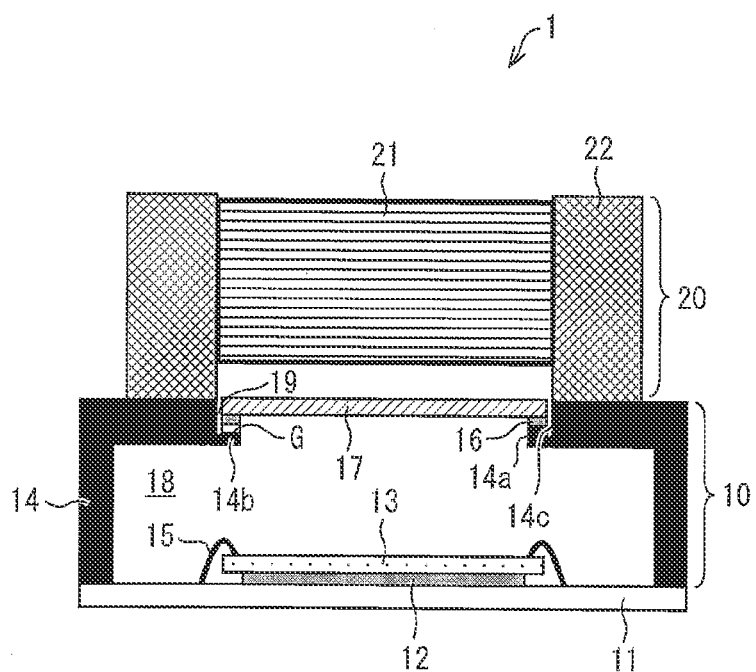
FIG. 1 is a cross-sectional view illustrating a configuration of a camera module in Embodiment 1 of the present invention.

The following description will discuss a configuration of a camera module according to Embodiment 1 with reference to FIG. 1. FIG. 1 is a cross-sectional view illustrating the configuration of the camera module according to Embodiment 1.

As illustrated in FIG. 1, a camera module 1 of Embodiment 1 includes: an image pickup package 10; and a lens unit 20 serving as an optical section mounted on the image pickup package 10.

The image pickup package 10 includes: a solid state image pickup element 13 mounted on a wiring substrate 11 as a substrate via an adhesive 12; and a sensor cover 14 for covering the wiring substrate 11 and the solid state image pickup element 13. The solid state image pickup element 13 is connected to the wiring substrate 11 via a wire 15.

An opening 14a is provided in a center position of the sensor cover 14, and, a glass substrate 17 serving as a transparent plate whose end section is adhered with use of an adhesive 16 is provided on the opening 14a. As a result, an internal space 18 surrounded by the glass substrate 17, the sensor cover 14, and the wiring substrate 11 is provided in the image pickup package 10. Note that the transparent plate is not necessarily made of glass, and another transparent plate may be used.

Meanwhile, the lens unit 20 is made up of an image pickup lens 21 and a lens holder 22 for retaining the image pickup lens 21. The lens unit 20 is provided above the solid state image pickup element 13 and the glass substrate 17 of the image pickup package 10.

Note that, in Embodiment 1, the lens unit 20 is the simplest fixed-focus lens unit including the image pickup lens 21 and the lens holder 22. However, the lens unit 20 is not limited thereto, and, even if the lens unit 20 further includes a lens driving device such as an autofocus mechanism, a zooming mechanism, or a macro photography mechanism, effects of the present invention do not change.

(Ventilation Groove of Camera Module)

In a case of the camera module 1 of Embodiment 1, thermal expansion of gas in the internal space 18 may occur due to a rise in temperature, with the result that the adhesive 16 may come off. Therefore, it is necessary to provide a ventilation hole for allowing the internal space 18 of the image pickup package 10 to communicate with the outside. In this case, in a case where the ventilation hole is provided to be placed directly under the image pickup element and the image pickup element and the wiring substrate are partially adhered to each other like the camera module disclosed in Patent Literature 1, the image pickup element may be inclined due to the thickness of the adhesive layers.

In view of the circumstances, the camera module 1 of Embodiment 1 obtains air-permeability between the internal space 18 and open air as follows.

A structure for obtaining the air-permeability in Embodiment 1 will be described with reference to FIG. 1, (a) of FIG. 2, (b) of FIG. 2, (a) of FIG. 3, and (b) of FIG. 3. (a) of FIG. 2 is a plan view illustrating a configuration of the image pickup package 10 of the camera module 1 other than the glass substrate 17, and (b) of FIG. 2 is a cross-sectional view taken along the arrows X-X of (a) of FIG. 2. (a) of FIG. 3 is a plan view illustrating a configuration of the image pickup package of the camera module, i.e., a configuration in which the substrate 17 is mounted, and (b) of FIG. 3 is a cross-sectional view taken along the arrows X-X of (a). (a) of FIG. 4 to (d) of FIG. 4 are plan views illustrating shapes of a ventilation groove provided in the sensor cover 14 of the image pickup package 10 on a plan view.

As illustrated in FIG. 1, (a) of FIG. 2, and (b) of FIG. 2, in the camera module 1 of Embodiment 1, a single ventilation groove G for allowing the internal space 18 to communicate with an outside of the sensor cover 14 is provided on an adhesive surface of the glass substrate 17 above the sensor cover 14. Specifically, an inner edge of the sensor cover 14, i.e., a section in the vicinity of the opening 14a provided centrally is a step section 14b, and, on a top surface of the step section 14b, the single ventilation groove G extending from an inner side to an outer side is provided. The step section 14b is adhered to the glass substrate 17 via the adhesive 16 so as to have a gap 19 between the glass substrate 17 and a standing-up wall surface 14c of the step section 14b. As a result, in a state in which the glass substrate 17 is mounted on the step section 14b of the sensor cover 14, the internal space 18 communicates with the outside of the sensor cover 14, i.e., open air through the ventilation groove G and the gap 19. The lens unit 20 including the image pickup lens 21 is provided on the sensor cover 14. The lens unit 20 including the image pickup lens 21 is not sealed and communicates with the outside of the camera module 1, i.e., open air through a minute gap. Such communication between the internal space 18 and the outside of the sensor cover 14 is equivalent to communication between the internal space 18 and the outside of the camera module 1, i.e., open air. Air-permeability of the lens unit 20 is obtained by a minute gap. Therefore, foreign matters hardly intrude into the ventilation groove G from the outside of the camera module 1 via the lens unit 20.

Note that, while only one ventilation groove G is provided in Embodiment 1, it is not always limited thereto, and two or more ventilation grooves may be used. That is, at least one ventilation groove G needs to be provided.

The ventilation groove G is a groove for releasing, toward the outside, gas and ions generated from the adhesives 12 and 16 in the internal space 18 of the image pickup package 10. In a case where the glass substrate 17 is mounted on the sensor cover 14, the ventilation groove G is prevented from clogging by having such a depth that the adhesive 16 extended by pressing is not fully filled with the ventilation groove G.

That is, the adhesive 16 is applied in a straight line so as to surround the opening 14a as shown in the chain double-dashed line in (a) of FIG. 2, however, the adhesive 16 is applied near the ventilation groove G.

As described above, in a case where the adhesive 16 is applied in a straight line to the top surface of the step section 14b so as to surround the opening 14a and the glass substrate 17 is mounted, as shown in (a) of FIG. 3 and (b) of FIG. 3, an area of the adhesive 16 applied to the top surface of the step section 14b is extended and surplus adhesive 16 is flown into the ventilation groove G. However, by appropriately managing the depth of the ventilation groove G, the ventilation groove G is not completely clogged with the adhesive 16, and air-permeability can be obtained by having a gap 16a.

The depth of the ventilation groove G is a minimum value that can achieve both purpose of placing the ventilation groove G, i.e., releasing of gas present in the internal space 18 and prevention of intrusion of foreign matters from the outside unless clogging of the adhesive 16 is considered. For example, the minimum value is ideally 0.01 mm to 0.1 mm. However, in order to have an extra depth to prevent clogging of the ventilation groove G with the adhesive 16 flown to the ventilation groove G, the depth is, for example, about 0.015 mm to 0.040 mm appropriately. At this time, the ventilation groove G preferably has a length of, for example, 0.2 mm to 1.0 mm and a width of, for example, 0.1 mm to 0.5 mm.

The shape of the ventilation groove G on a plan view is not always necessary to be a straight line shape and the ventilation groove G can have, for example, a circular arc shape on the plan view. Further, as shown in (a) of FIG. 4, (b) of FIG. 4, and (c) of FIG. 4, the shape on the plan view can be also curved in a square shape or a round shape. As shown in (d) of FIG. 4, it is also possible to provide a circular recess section $G_H$ to trap foreign matters which have intruded into the ventilation groove G. With this, the foreign matters which have intruded into the ventilation groove G cannot easily to arrive at the internal space 18.

As described above, in Embodiment 1, by preventing airtight of the internal space 18 of the image pickup package 10, it is possible to prevent breakage of the camera module 1 caused by thermal expansion of gas in the internal space 18 or fogginess of the glass substrate 17 because of gas or ions generated in the inside. Further, instead of providing a through hole for ventilation in a region where the solid state image pickup element 13 is provided, the ventilation groove G is provided on a plan surface of the sensor cover 14 to which the glass substrate 17 is adhered. This prevents inclination of the solid state image pickup element 13 caused by providing of the through hole, and can reduce fraction defective of the camera module 1. Further, in a case where application of the adhesive 16 is performed by an automatic machine, it is possible to easily set a range of application by designating a line of the ventilation groove G with use of an image recognition function.

(Modified Example of Ventilation Groove of Camera Module)

The following description will discuss a modified example of the ventilation groove G of the camera module 1 with reference to (a) of FIG. 5, (b) of FIG. 5 to (a) of FIG. 8, (b) of FIG. 8. (a) of FIG. 5 is a plan view illustrating a configuration of a modified example of the image pickup package 10 of the camera module 1 other than the glass substrate 17. (b) of FIG. 5 is a cross-sectional view taken along the arrows X-X of (a). (a) of FIG. 6 is a plan view illustrating a configuration of a modified example of the image pickup package 10 of the camera module 1, that is, a plan view illustrating a configuration in which the glass substrate 17 is provided. (b) of FIG. 6 is a cross-sectional view taken along the arrows X-X of (a). (a) of FIG. 7 is a plan view illustrating a configuration of another modified example of the image pickup package of the camera module. (b) of FIG. 7 is a cross-sectional view taken along the arrows Y-Y of (a). (a) of FIG. 8 is a plan view illustrating a configuration of still another modified example of the image pickup package of the camera module. (b) of FIG. 8 is a cross-sectional view taken along the arrows Y-Y of (a).

In (a) of FIG. 2, (b) of FIG. 2, (a) of FIG. 3, and (b) of FIG. 3, a single ventilation groove G is provided. However, in the camera module 1 of Embodiment 1, it is possible to form recess grooves S, S along the ventilation groove G on both sides of the single ventilation groove G as shown in (a) of FIG. 5 and (b) of FIG. 5.

That is, in the configuration of the modified example, three straight grooves are provided on a plan surface of the step section 14b of the sensor cover 14. The center groove is the ventilation groove G for releasing, to the outside, gas and ions generated from the adhesives 12, 16 in the internal space 18 of the image pickup package 10. The two grooves on the both sides of the ventilation groove G are the recess grooves S, S provided to prevent the adhesive 16 from flowing into the ventilation groove G. The recess grooves S, S, as well as the ventilation groove G, are also structured so that the internal space 18 communicates with the outside of the sensor cover 14.

Also in this modified example, the application of the adhesive 16 is performed to surround the opening 14a as shown in (a) of FIG. 5, however, the adhesive 16 is applied near the front recess grooves S, S.

In the configuration of this modified example, in view of the purpose of placing the ventilation groove G, the depth of the ventilation groove G is ideally a minimum value that can release gas present in the internal space 18 and prevent intrusion of foreign matters from the outside.

Therefore, in consideration of providing precision of the ventilation groove G, the depth is appropriately about 0.015 mm to 0.030 mm. Since foreign matters intrude if the depth of the recess grooves S, S is too large, the depth is set to be the same as that of the ventilation groove G, i.e., 0.015 mm to 0.030 mm.

All the ventilation groove G and the recess grooves S, S have a length of 0.2 mm to 1.0 mm and a width of 0.1 mm to 0.5 mm.

In the above configuration, in a case where the glass substrate 17 is mounted on the sensor cover 14, as shown in (a) of FIG. 6 and (b) of FIG. 6, the area of the adhesive 16 applied to the plan surface of the step section 14b of the sensor cover 14 is expanded. However, the surplus adhesive 16 is flown into the recess grooves S, S and is not flown into the ventilation groove G.

In the above modified example, the recess grooves S, S, as well as the ventilation groove G, are structured so that the internal space 18 communicates with the outside of the sensor cover 14. However, the recess grooves S, S are not always necessary to be structured as described above, and, for example, the recess grooves S, S can be shortened by blocking one end sections of the recess grooves S, S.

That is, a purpose of providing the recess grooves S, S is, as described above, to prevent the adhesive 16 on which the glass substrate 17 is mounted from flowing to the ventilation groove G, and the inflow of the adhesive 16 can be prevented more effectively as the recess grooves S, S become deeper. However, as shown in (a) of FIG. 6 and (b) of FIG. 6, in a case where the recess grooves S, S, as well as the ventilation groove G, has the internal space 18 communicating with the outside of the sensor cover 14, a possibility of intrusion of foreign matters into the internal space 18 becomes high if the recess grooves S, S become deeper.

In view of this, as shown in, for example, (a) of FIG. 7 and (b) of FIG. 7, recess grooves S1, S1 are provided on the sensor cover 14 so that the recess grooves S1, S1 are positioned inside an outer periphery of the glass substrate 17 and communicate with the internal space 18. In this configuration example, the recess grooves S, S are shortened and the recess grooves S1, S1 are completely covered with the glass substrate 17.

With this configuration, even if the recess grooves S1 becomes deeper, there is a very low possibility that foreign matters intrude through the recess grooves S1, S1. In this case, the recess grooves S1, S1 are set to have a length of 0.1 mm to 0.3 mm. The recess groove 23 are set to have a depth of 0.015 mm to 0.1 mm and a width of 0.1 mm to 0.5 mm. The reason why the length of the recess grooves S1, S1 is shortened, i.e., 0.1 mm to 0.3 mm is that the recess grooves S1, S1 are completely covered with the glass substrate 17 in consideration of a clearance between the glass substrate 17 and the plan surface of the step section 14b of the sensor cover 14 on which the glass substrate 17 is mounted. That is, in a case where the adhesive 16 is not fully filled between the plan surface of the step section 14b and a back surface of the glass substrate 17 of a blocked section of each of the recess grooves S1, S1, i.e., in a case where there is a gap which is not filled with the adhesive 16 therebetween, the recess grooves S1, S1 are not blocked. In this state, in a case where the glass substrate 17 is mounted on the sensor cover 14, a mounting location of the glass substrate 17 is slightly shifted and the end sections of the recess grooves S1, S1 are not covered with the glass substrate 17, i.e., the end sections are exposed, a possibility of intrusion of foreign matters into the recess grooves S1, S1 becomes high. Therefore, it is necessary to cover the recess grooves S1, S1 with glass substrate 17 for certain by shortening the recess grooves S1, S1.

Meanwhile, as shown in (a) of FIG. 8 and (b) of FIG. 8, recess grooves S2, S2 can be also positioned outside the opening 14a of the sensor cover 14 and communicate with the outside of the sensor cover 14.

In this case, the recess grooves S2, S2 are shortened by providing blocked sections on a side of the internal space 18. As a result, the recess grooves S2, S2 can prevent foreign matters from intruding from the outside through the recess grooves S2, S2 because the recess grooves S2, S2 has no air-permeability. By providing deeper recess grooves S2, S2, the inflow of the adhesive 16 can be prevented more effectively. In the configuration of (a) of FIG. 7 and (b) of FIG. 7, the recess grooves S1, S1 need to be shortened since the recess grooves S1, S1 need to be covered with the glass substrate 17 for certain. However, in the configuration of (a) of FIG. 8 and (b) of FIG. 8, since the recess grooves S2, S2 do not need to be completely covered with the glass substrate 17, the length of the recess grooves S2, S2 can be larger than the length of the recess grooves S1, S1 of the configuration example illustrated in (a) of FIG. 7 and (b) of FIG. 7. Therefore, the recess grooves S2, S2 are set to have a larger length, i.e., a length of 0.2 mm to 0.9 mm. Further, the recess grooves S2, S2 are set to have a depth of 0.015 mm to 0.1 mm and a width of 0.1 mm to 0.5 mm.

As a result, the recess grooves S2, S2 can function more effectively.

Accordingly, in Embodiment 1, by providing a plurality of grooves in a portion where the plan surface of the sensor cover 14 of the image pickup package 10 is adhered to the glass substrate 17, the ventilation groove G enabling air-permeability between the inside of the image pickup package 10 and open air is provided, which can prevent fogginess in the inside of the camera module 1 caused by change in atmospheric pressure and in temperature. Further, provision of the recess grooves S, S, recess grooves S1, S1, or the recess grooves S2, S2 on the both sides of the ventilation groove G prevents clogging of the ventilation groove G caused by the inflow of the adhesive 16. Furthermore, effective placement of the recess grooves S, S, the recess grooves S1, S1, or the recess grooves S2, S2 for preventing clogging of the ventilation groove G with the adhesive 16 improves reliability of the camera module 1.

As described above, by adhering the glass substrate 17 to the sensor cover 14 so that the glass substrate 17 covers the opening 14a of the sensor cover 14 for covering the solid state image pickup element 13 mounted on the wiring substrate 11, which opening 14a is provided above the solid state image pickup element 13, the camera module 1 of Embodiment 1 includes: the image pickup package 10 in which the wiring substrate 11, the sensor cover 14, and the glass substrate 17 define the internal space 18; and the image pickup lens 21 provided above the glass substrate 17 of the image pickup package 10. On the adhesive surface of the glass substrate 17 above the sensor cover 14, at least one ventilation groove G so that the internal space 18 communicates with open air is provided.

As a result, the ventilation groove G is provided not on the wiring substrate 11 below the solid state image pickup element 13, but is provided between the sensor cover 14 and the glass substrate 17, i.e., is provided on the plan surface of the step section 14b of the sensor cover 14 to which the glass substrate 17 is adhered. Therefore, it is not necessary to partially provide adhesive layers on a bottom of the solid state image pickup element 13, which is an inclination factor of the solid state image pickup element 13. That is, in Embodiment 1, the adhesive 12 is applied to a whole surface of a bottom surface of the solid state image pickup element 13.

The at least one ventilation groove G provided on the plan surface of the step section 14b of the sensor cover 14 to which the glass substrate 17 is adhered has not only a function of the ventilation groove G which allows the internal space 18 in which the solid state image pickup element 13 is provided to communicate with open air, but also a function as a recess groove to prevent clogging of the ventilation groove G with the adhesive 16, which can be caused by expansion of the adhesive 16 when the glass substrate 17 is pressed to the sensor cover 14. That is, for example, even if the adhesive 16 intrudes into the ventilation groove G, since the ventilation groove G is a recess section, the recess section is not fully filled with the adhesive 16 by managing an amount of the adhesive 16 as appropriate, and a slight gap 16a still exists in a top surface of the recess section because of capillarity. As a result, the ventilation groove G serves as the recess groove of the adhesive 16. Because of the gap 16a, air-permeability can be obtained.

Accordingly, the present invention can provide the camera module 1 which can obtain air-permeability between the internal space 18 of the image pickup package 10 and open air while the solid state image pickup element 13 is not being inclined.

In the camera module 1 of Embodiment 1, on the each side of the ventilation groove G, the recess grooves S, S, the recess grooves S1, S1, or the recess grooves S2, S2 for preventing inflow of the adhesive 16 into the ventilation groove G are preferably provided along the ventilation groove G.

With this structure, when the glass substrate 17 is adhered to the sensor cover 14, the adhesive 16 flows into the recess grooves S, S, the recess grooves S1, S1, or the recess grooves S2, S2 provided along the both sides of the ventilation groove G and does not flow into the ventilation groove G sandwiched by the recess grooves S, S, the recess grooves S1, S1, or the recess grooves S2, S2. Therefore, it is possible to further prevent the adhesive 16 from blocking the ventilation groove G.

In the camera module 1 of Embodiment 1, the ventilation groove G has a depth of 0.01 mm to 0.1 mm. This makes it possible so that the internal space 18 communicates with open air, and therefore air-permeability can be obtained.

In the camera module 1 of Embodiment 1, the ventilation groove G has a straight shape, a circular arc shape, or a curved shape on a plan view. Therefore, in a case where the ventilation groove G has a straight shape on the plan view, it is possible to satisfactorily obtain air-permeability between the internal space 18 and the outside of the sensor cover 14. Further, in a case where the ventilation groove G has a circular arc shape or a curved shape on the plan view, foreign matters which have intruded into the ventilation groove G cannot easily arrive at the internal space 18.

In the camera module 1 of Embodiment 1, it is preferable that the ventilation groove G have the recess section $G_H$ for trapping foreign matters which have intruded into the inside of the ventilation groove G.

With this structure, the recess section $G_H$ is provided on a bottom surface of the ventilation groove G, so that, even if foreign matters intrude into the ventilation groove G, the foreign matters are trapped by the recess section $G_H$. This makes it possible to further prevent foreign matters from arriving at the internal space 18.

In the camera module 1 of Embodiment 1, the recess grooves S, S can be provided so that the internal space 18 communicates with open air. With this, the recess grooves S, S also have a function as the ventilation groove G. Therefore, because at least three ventilation grooves G exist, it is possible to obtain satisfactory air-permeability between the internal space 18 and the outside of the sensor cover 14 even if the adhesive 16 intrudes into a part of the ventilation grooves G.

In the camera module 1 of Embodiment 1, the recess grooves S1, S1 can be also provided on the sensor cover 14 in such a manner as to be positioned inside the outer periphery of the glass substrate 17 and communicate with the internal space 18.

By blocking open-air-side ends of the recess grooves S, S, it is possible to prevent foreign matters from intruding through the recess grooves S1, S1.

In the camera module 1 of Embodiment 1, the recess grooves S2, S2 can be positioned outside the opening of the sensor cover 14 and communicate with open air. By blocking internal-space-18-side ends of the recess grooves S, S, it is possible to prevent foreign matters from intruding through the recess grooves S2, S2.

Note that the present invention is not limited to the embodiment, and may be varied in many ways within the scope of the present invention.

For example, as illustrated in FIG. 9, the present invention can be applied to a camera module including a cover body integrally provided to have both a lens holder function and a sensor cover function. Although not shown, by providing the ventilation groove on a surface to which a transparent plate is adhered, the present invention can be also applied to a camera module including a cover body in which a lens driving mechanism including the image pickup lens 21 is mounted directly on the wiring substrate 11.

Embodiment 2

The following description will discuss another embodiment of the present invention with reference to FIG. 10. Note that a configuration other than the following configuration described in Embodiment 2 is the same as that in Embodiment 1. For the sake of easy explanation, members having the like functions as the figures described in Embodiment 1 are denoted by the like reference signs and the detailed description thereof is omitted.

A camera module 1A of Embodiment 2 is different from the camera module 1 having the ventilation groove G and the recess grooves S, S, which has been described in FIG. 6 of Embodiment 1, in that the ventilation groove G is non-linear or curved as illustrated in FIG. 10.

That is, as illustrated in FIG. 10, by adhering the glass substrate 17 serving as a transparent plate to the sensor cover 14 so that the glass substrate 17 covers the opening 14a of the sensor cover 14 serving as a cover body for covering the solid image pickup element 13 serving as an image pickup element mounted on the wiring substrate 11 serving as a substrate, which opening 14a is provided above the solid image pickup element 13, the camera module 1A of Embodiment 2 includes: the image pickup package 10 in which the wiring substrate 11, the sensor cover 14, and the glass substrate 17 define the internal space 18; and the image pickup lens 21 provided above the glass substrate 17 in the image pickup package 10. Further, at least one ventilation groove G1 for allowing the internal space 18 to communicate with open air is provided on the adhesive surface of the glass substrate 17 above the sensor cover 14. On the both sides of the ventilation groove G1, the recess grooves S, S for preventing inflow of the adhesive 16 into the ventilation groove G1 are provided along the ventilation groove G1.

The ventilation groove G1 has a circular arc or curved shape on a plan view, and the ventilation groove G1 is provided so that the internal space 18 communicates with the open air. Note that the ventilation groove G1 illustrated in FIG. 10 has a curved shape, however, the shape on the plan view is not limited thereto, and may be a circular arc shape.

With this configuration, the ventilation groove G1 has a circular arc shape or a curved shape on the plan view, so that foreign matters which have intruded into the ventilation groove G1 cannot easily arrive at the internal space 18.

The recess grooves S, S is provided so that the internal space 18 communicates with open air, so that the recess grooves S, S also have a function as a ventilation groove. Therefore, because at least three ventilation grooves G exist, it is possible to obtain satisfactory air-permeability between the internal space 18 and the outside of the sensor cover 14 even if the adhesive 16 intrudes into a part of the ventilation grooves G.

Embodiment 3

The following description will discuss still another embodiment of the present invention with reference to FIG. 11. Note that a configuration other than the following configuration described in Embodiment 3 is the same as that in Embodiments 1 and 2. For the sake of easy explanation, members having the like functions as the figures described in Embodiment 1 and 2 are denoted by the like reference signs and the detailed description thereof is omitted.

The camera module 1B of Embodiment 3 is different from the camera module 1 having the ventilation groove G and the recess grooves S1, S1, which has been described in FIG. 7 of Embodiment 1, in that the ventilation groove G is curved as illustrated in FIG. 11.

In other words, as illustrated in FIG. 11, the camera module 1B of Embodiment 3 is structured such that, in the camera module 1A having the curved ventilation groove G1 and the recess grooves S, S, which has been described in FIG. 10 of the Embodiment 2, the recess grooves S1, S1 are completely covered with the glass substrate 17 by providing the recess grooves S1, S1 which have been provided by shortening the recess grooves S, S. Therefore, the recess grooves S1, S1 are different from the recess grooves S, S in that the recess grooves S1, S1 are provided on the sensor cover 14 so as to be positioned inside the outer periphery of the glass substrate 17 and the recess grooves S1, S1 communicate with the internal space 18.

That is, as illustrated in FIG. 11, by adhering the glass substrate 17 serving as a transparent plate to the sensor cover 14 so that the glass substrate 17 covers the opening 14a of the sensor cover 14 serving as a cover body for covering the solid image pickup element 13 serving as an image pickup element mounted on the wiring substrate 11 serving as a substrate, which opening 14a is provided above the solid image pickup element 13, the camera module 1B of Embodiment 3 includes: the image pickup package 10 in which the wiring substrate 11, the sensor cover 14, and the glass substrate 17 define the internal space 18; and the image pickup lens 21 provided above the glass substrate 17 in the image pickup package 10. Further, at least one ventilation groove G1 for allowing the internal space 18 to communicate with open air is provided on a plane of the sensor cover 14 on which plane the glass substrate 17 is attached. On the each side of the ventilation groove G1, the recess grooves S1, S1 for preventing inflow of the adhesive 16 into the ventilation groove G1 are provided along the ventilation groove G1.

The ventilation groove G1 has a circular arc shape or a curved shape on the plan view, and is provided so that the internal space 18 communicates with open air, and the recess grooves S1, S1 are provided on the sensor cover 14 in such a manner as to be positioned inside the outer periphery of the glass substrate 17 and communicate with the internal space 18.

Therefore, the ventilation groove G1 has a circular arc shape or a curved shape on the plan view, so that foreign matters which have intruded into the ventilation groove G1 cannot easily arrive at the internal space 18.

In the camera module 1B of Embodiment 3, the recess grooves S1, S1 are provided on the sensor cover 14 in such a manner as to be positioned inside the outer periphery of the glass substrate 17 and communicate with the internal space 18.

With this configuration, even if the recess grooves S1 becomes deeper, there is a very low possibility that foreign matters intrude through the recess grooves S1, S1. In this case, the recess grooves S1, S1 are set to have a length of 0.1 mm to 0.3 mm. The recess groove S1 are set to have a depth of 0.015 mm to 0.1 mm and a width of 0.1 mm to 0.5 mm. The reason why the length of the recess grooves S1, S1 is shortened, i.e., 0.1 mm to 0.3 mm is that the recess grooves S1, S1 are completely covered with the glass substrate 17 in consideration of a clearance between the glass substrate 17 and the plan surface of the step section 14b of the sensor cover 14 on which the glass substrate 17 is mounted. That is, in a case where the adhesive 16 is not fully filled between the plan surface of the step section 14b and a back surface of the glass substrate 17 of a blocked section of each of the recess grooves S1, S1, i.e., in a case where there is a gap which is not filled with the adhesive 16 therebetween, the recess grooves S1, S1 are not blocked. In this state, in a case where the glass substrate 17 is mounted on the sensor cover 14, a mounting location of the glass substrate 17 is slightly shifted and the end sections of the recess grooves S1, S1 are not covered with the glass substrate 17, i.e., the end sections are exposed, a possibility of intrusion of foreign matters into the recess grooves S1, S1 becomes high. Therefore, it is necessary to cover the recess grooves S1, S1 with glass substrate 17 for certain by shortening the recess grooves S1, S1.

Embodiment 4

The following description will discuss still another embodiment of the present invention with reference to FIG. 12. Note that a configuration other than the following configuration described in Embodiment 4 is the same as that in Embodiments 1 to 3. For the sake of easy explanation, members having the like functions as the figures described in Embodiment 1 to 3 are denoted by the like reference signs and the detailed description thereof is omitted.

The camera module 1C of Embodiment 4 is different from the camera module 1 having the ventilation groove G and the recess grooves S2, S2, which has been described in FIG. 8 of Embodiment 1, in that the ventilation groove G is curved as illustrated in FIG. 12.

In other words, as illustrated in FIG. 12, the camera module 1C of Embodiment 4 is different from the camera module 1A having the curved ventilation groove G1 and the recess grooves S, S, which has been described in FIG. 10, in that the recess grooves S2, S2 (i) are provided by shortening the recess grooves S1, S1 and (ii) are positioned outside the opening 14a of the sensor cover 14 to be communicate with open air.

That is, as illustrated in FIG. 12, by adhering the glass substrate 17 serving as a transparent plate to the sensor cover 14 so that the glass substrate 17 covers the opening 14a of the sensor cover 14 serving as a cover body for covering the solid image pickup element 13 serving as an image pickup element mounted on the wiring substrate 11 serving as a substrate, which opening 14a is provided above the solid image pickup element 13, the camera module 1C of Embodiment 4 includes: the image pickup package 10 in which the wiring substrate 11, the sensor cover 14, and the glass substrate 17 define the internal space 18; and the image pickup lens 21 provided above the glass substrate 17 in the image pickup package 10. Further, at least one ventilation groove G1 for allowing the internal space 18 to communicate with open air is provided on the plane of the sensor cover 14 on which plane the glass substrate 17 is attached. On the each side of the ventilation groove G1, The recess grooves S2, S2 for preventing inflow of the adhesive 16 into the ventilation groove G1 are provided along the ventilation groove G1.

The ventilation groove G1 has a circular arc shape or a curved shape on the plan view, and is provided so that the internal space 18 communicates with open air, the recess grooves S2, S2 are positioned outside the opening 14a of the sensor cover 14 to be communicate with open air.

Therefore, the ventilation groove G1 has a circular arc shape or a curved shape on the plan view, so that foreign matters which have intruded into the ventilation groove G1 cannot easily arrive at the internal space 18.

In the camera module 1C of Embodiment 4, the recess grooves S2, S2 are positioned outside the opening 14a of the sensor cover 14 to be communicate with open air.

With this configuration, the recess grooves S2, S2 are shortened by providing blocked sections on a side of the internal space 18. As a result, the recess grooves S2, S2 can prevent foreign matters from intruding from the outside through the recess grooves S2, S2 because the recess grooves S2, S2 has no air-permeability. By providing deeper recess grooves S2, S2, the inflow of the adhesive 16 can be prevented more effectively. In the configuration of (a) of FIG. 11 and (b) of FIG. 11, the recess grooves S1, S1 need to be shortened since the recess grooves S1, S1 need to be covered with the glass substrate 17 for certain. However, in the configuration of (a) of FIG. 12 and (b) of FIG. 12, since the recess grooves S2, S2 do not need to be completely covered with the glass substrate 17, the length of the recess grooves S2, S2 can be larger than the length of the recess grooves S1, S1 of the configuration example illustrated in (a) of FIG. 11 and (b) of FIG. 11. Therefore, the recess grooves S2, S2 are set to have a larger length, i.e., a length of 0.2 mm to 0.9 mm. Further, the recess grooves S2, S2 are set to have a depth of 0.015 mm to 0.1 mm and a width of 0.1 mm to 0.5 mm.

As a result, the recess grooves S2, S2 can function more effectively.

(Summary)

Each of the camera modules 1, 1A, 1B, and 1C of an aspect 1 includes: an image pickup package 10 including a substrate (wiring substrate 11), an image pickup element 21 on the substrate (wiring substrate 11), and a cover body (sensor cover 14) for covering the image pickup element (solid image pickup element 13) on the substrate (wiring substrate 11), a transparent plate (glass substrate 17) being attached to the cover body in such a manner that the transparent plate (glass substrate 17) covers an opening of the cover body (sensor cover 14) which opening is above the image pickup element (solid image pickup element 13), so that the substrate (wiring substrate 11), the cover body (sensor cover 14), and the transparent plate (glass substrate 17) define an internal space 18; and an image pickup lens provided above the transparent plate of the image pickup package 10, wherein at least one ventilation groove G or G1 for allowing the internal space 18 to communicate with open air is provided on a plane of the cover body (sensor cover 14) on which plane the transparent plate (glass substrate 17) is attached.

According to the above invention, the camera module includes an image pickup package including a substrate, an image pickup element on the substrate, and a cover body for covering the image pickup element on the substrate, a transparent plate being attached to the cover body in such a manner that the transparent plate covers an opening of the cover body which opening is above the image pickup element, so that the substrate, the cover body, and the transparent plate define an internal space; and an image pickup lens provided above the transparent plate of the image pickup package.

In a case of the camera module having the above configuration, thermal expansion of gas in the internal space may occur due to a rise in temperature, with the result that the adhesive may come off. Therefore, it is necessary to provide a ventilation hole for allowing the internal space of the image pickup package to communicate with open air. In this case, in a case where the ventilation hole is provided to be placed directly under the image pickup element and the image pickup element and the wiring substrate are partially adhered to each other like the camera module disclosed in Patent Literature 1, the image pickup element may be inclined due to the thickness of the adhesive layers.

In view of the circumstances, in the present invention, at least one ventilation groove is provided on the plane of the cover body on which plane the transparent plate is attached, so that the internal space communicates with open air.

As a result, the ventilation groove is provided not on the wiring substrate directly under the image pickup element, but is provided between the cover body and the transparent plate, i.e., is provided on a plan surface section of the cover body to which the transparent plate is adhered. Therefore, it is not necessary to partially provide an adhesive layer on a bottom of the solid state image pickup element, which is an inclination factor of the image pickup element.

The at least one ventilation groove provided on the plan surface of the cover body to which the transparent plate is adhered has not only a function of the ventilation groove which allows the internal space in which the image pickup element is provided to communicate with open air but also a function as a recess groove to prevent clogging of the ventilation groove with the adhesive, which clogging could be caused by expansion of the adhesive when the transparent plate is pressed to the cover body. That is, for example, even if the adhesive intrudes into the ventilation groove, since the ventilation groove is a recess section, the recess section is not fully filled with the adhesive by managing an amount of the adhesive as appropriate, and a slight gap still exists in a top surface of the recess section because of capillarity. As a result, the ventilation groove serves as the recess groove of the adhesive. Further, because of the gap, air-permeability can be obtained.

Accordingly, the present invention can provide the camera module which can obtain air-permeability between the internal space of the image pickup package and open air while the image pickup element is not being inclined.

In each of the camera modules 1, 1A, 1B, and 1C of an aspect 2 of the present invention according to the camera module 1 of the aspect 1, on each side of the ventilation groove G or G1, the recess groove S, S1, or S2 for preventing the adhesive 16 from flowing into the ventilation groove G or G1 is provided along the ventilation groove G or G1.

With this structure, when the transparent plate is adhered to the cover body, the adhesive flows into the recess grooves provided on each side of the ventilation groove. This makes it possible to prevent the adhesive from flowing into the ventilation groove sandwiched by the recess grooves. Therefore, it is possible to further prevent the adhesive from blocking the ventilation groove.

In each of the camera modules 1, 1A, 1B, and 1C of an aspect 3 of the present invention according to the camera module 1 of the aspect 1 or 2, the ventilation groove G or G1 has a depth of 0.01 mm to 0.1 mm.

This makes it possible to allows the internal space to communicate with the outside of the cover body, and therefore the camera module can obtain air-permeability.

In each of the camera modules 1, 1A, 1B, and 1C of an aspect 4 of the present invention according to the camera module 1, 2, or 3 of the aspect 1, 2, or 3, the ventilation groove G or G1 has a straight shape, a circular arc shape, or a curved shape on the plan view.

This makes it possible to obtain satisfactory air-permeability between the internal space and the outside of the cover body in a case where the ventilation groove has a straight shape on the plan view. Further, in a case where the ventilation groove has a circular arc shape or a curved shape on the plan view, foreign matters which have intrude into the ventilation groove cannot easily arrive at the internal space.

In the camera module 1, 1A, 1B, and 1C of an aspect 5 of the present invention according to the camera module 1 according to any one of the aspects 1 to 4, the ventilation groove G or G1 has a recess section $G_H$ for trapping foreign matters which have intruded into an inside of the ventilation groove G or G1.

Therefore, since the recess section is provided on a bottom surface of the ventilation groove, foreign matters are trapped by the recess section even if the foreign matters intrude into the ventilation groove. This makes it possible to further prevent foreign matters from arriving at the internal space.

In the camera module 1 of an aspect 6 of the present invention according to the camera module 1 of the aspect 2, the recess groove S is provided so that the internal space 18 communicates with open air.

Therefore, the recess groove also has a function as a ventilation groove. Therefore, at least three ventilation grooves exist, so that it is possible to obtain satisfactory air-permeability between the internal space and the outside of the cover coy (sensor cover 14) even if the adhesive flows into a part of the ventilation grooves.

In the camera module 1, 1A, 1B, and 1C of an aspect 7 of the present invention according to the camera module 1 of the aspect 2, the recess groove S1 is provided on the cover body (sensor cover 14) in such a manner as to be positioned inside an outer periphery of the transparent plate (glass substrate 17) and communicates with the internal space 18.

Therefore, by blocking an open-air-side end of the recess groove, foreign matters can be prevented from intruding through the recess groove.

In the camera module 1 of an aspect 8 of the present invention according to the camera module 1 of the aspect 2, the recess groove S2 is provided the on the cover body (sensor cover 14) in such a manner as to be positioned outside the opening 14a of the cover body (sensor cover 14) and communicates with open air.

Therefore, by blocking an internal-space-side end of the recess groove, foreign matters can be prevented from intruding through the recess groove.

In the camera module 1A of an aspect 9 of the present invention according to the camera module 1 of aspect 2, the ventilation groove G1 has a circular arc or a curved shape on a plan view; and the recess groove S is provided so that the internal space 18 communicates with open air.

Therefore, since the ventilation groove has a circular arc shape or a curved shape on a plan view, foreign matters which have intruded into the ventilation groove cannot easily arrive at the internal space.

Further, since the recess groove is provided so that the internal space communicates with open air, the recess groove also has a function as a ventilation groove. Therefore, at least three ventilation grooves exist, so that it is possible to obtain satisfactory air-permeability between the internal space and the outside of the sensor cover even if the adhesive intrudes into a part of the ventilation grooves.

In the camera module 1B of aspect 10 of the present invention according to the camera module 1 of aspect 2, the ventilation groove G1 has a circular arc shape or a curved shape on the plan view, and the recess groove S1 is provided on the cover body (sensor cover 14) so as to be positioned inside an outer periphery of the transparent plate (glass substrate 17) and communicates with the internal space 18.

Therefore, since the ventilation groove has a circular arc shape or a curved shape on the plan view, foreign matters which have intruded into the ventilation groove cannot easily arrive at the internal space.

Further, since the recess groove is provided on the cover body so as to be positioned inside the outer periphery of the transparent plate and communicates with the internal space, the open-air-side end of the recess groove is blocked. This makes it possible to prevent foreign matters from intruding from the recess groove.

In the camera module 1C of an aspect 11 of the present invention according to the camera module 1 of the aspect 2, the ventilation groove G1 has a circular arc shape or a curved shape on a plan view; and the recess groove S2 is provided outside the opening 14a of the cover body (sensor cover 14) and communicates with open air.

Therefore, since the ventilation groove has a circular arc shape or a curved shape on the plan view, foreign matters which have intruded into the ventilation groove cannot easily arrive at the internal space.

Further, since the recess groove is provided outside the opening of the cover body and communicates with open air, the inner-space-side end of the recess groove is blocked. This makes it possible to prevent foreign matters from intruding from the recess groove.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention is applicable to a camera module for use in capturing in a camera-equipped mobile phone, digital camera, security camera, television camera, or the like.

REFERENCE SIGNS LIST

1 Camera module
1A Camera module
1B Camera module
1C Camera module
10 Image pickup package
11 Wiring substrate (substrate)
12 Adhesive
13 Solid state image pickup element (image pickup element)
14 Sensor cover (cover body)
14a Opening
14b Step section
14c Standing-up wall surface
16 Adhesive
16a Gap
17 Glass substrate (transparent plate)
18 Internal space
19 Gap
20 Lens unit
21 Image pickup lens
22 Lens holder
G Ventilation groove
G1 Ventilation groove
$G_H$ Recess section
S Recess groove
S1 Recess groove
S2 Recess groove

The invention claimed is:

1. A camera module comprising:
an image pickup package including:
a substrate,
an image pickup element on the substrate,
a cover body for covering the image pickup element on the substrate,
a transparent plate being attached to the cover body in such a manner that the transparent plate covers an opening of the cover body which opening is above the image pickup element, so that the substrate, the cover body, and the transparent plate define an internal space; and
an image pickup lens provided above the transparent plate of the image pickup package,
a plurality of grooves being provided so as to be in a plane of the cover body on which plane the transparent plate is attached, the plurality of grooves being on a surface of the cover body which surface faces the transparent plate, and
at least one of the plurality of grooves configured to allow the internal space to communicate with open air, and
at least one of the plurality of grooves comprising a recess section configured to trap foreign matter which has intruded into an inside of said at least one of the plurality of grooves, the recess section being positioned lower than a bottom surface of said at least one of the plurality of grooves.

2. The camera module according to claim 1, wherein the plurality of grooves include a first groove and a second groove which face each other.

3. The camera module according to claim 1, wherein the plurality of grooves include a first groove, a second groove, and a third groove, and the first groove is provided between the second groove and the third groove.

4. The camera module according to claim 3, wherein the first groove, the second groove, and the third groove face one another.

5. The camera module according to claim 3, wherein the first groove is a ventilation groove, and the second groove and the third groove are each a groove for preventing an adhesive from flowing into the first groove.

6. The camera module according to claim 1, wherein each of the plurality of grooves has a depth of 0.01 mm to 0.1 mm.

7. The camera module according to claim 1, wherein each of the plurality of grooves has a straight line shape, a circular arc shape or a curved shape on a plan view.

8. A camera module comprising:
an image pickup package including:
a substrate,
an image pickup element on the substrate,
a cover body configured to cover the image pickup element on the substrate, and
a transparent plate being attached to the cover body in such a manner that the transparent plate covers an opening of the cover body which opening is above the image pickup element, so that the substrate, the cover body, and the transparent plate define an internal space; and an image pickup lens provided above the transparent plate of the image pickup package, a plurality of grooves being provided so as to be in a plane of the cover body on which plane the transparent plate is attached, the plurality of grooves being on a surface of the cover body which surface faces the transparent plate, at least one of the plurality of grooves configured to allow the internal space to communicate with open air, and an adhesive intruded into at least one of the plurality of grooves, but said at least one of the plurality of grooves being not fully filled with the adhesive and comprising a gap in a top surface of said at least one of the plurality of grooves which gap allows the internal space to communicate with open air.

* * * * *